(12) United States Patent
Bouvier Des Noes

(10) Patent No.: US 10,236,910 B2
(45) Date of Patent: Mar. 19, 2019

(54) ITERATIVE DECODING METHOD OF LFSR SEQUENCES WITH A LOW FALSE-ALARM PROBABILITY

(71) Applicant: Commissariat a L'Energie Atomique et aux Energies Alternatives, Paris (FR)

(72) Inventor: Mathieu Bouvier Des Noes, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 15/017,965

(22) Filed: Feb. 8, 2016

(65) Prior Publication Data

US 2016/0233885 A1    Aug. 11, 2016

(30) Foreign Application Priority Data

Feb. 11, 2015   (FR) ...................... 15 51116

(51) Int. Cl.
   *H03M 13/00*   (2006.01)
   *H03M 13/11*   (2006.01)
   (Continued)

(52) U.S. Cl.
   CPC .... *H03M 13/1111* (2013.01); *H03M 13/1191* (2013.01); *H03M 13/333* (2013.01);
   (Continued)

(58) Field of Classification Search
   CPC ............ H03M 13/1111; H03M 13/611; H03M 13/333; H03M 13/616; H03M 13/1191; H04B 1/7183
   See application file for complete search history.

(56) References Cited

U.S. PATENT DOCUMENTS 7,930,619 B2 * 4/2011  Shin ................... H03M 13/1111
                                             714/758
8,140,930 B1 * 3/2012  Maru ................. H03M 13/1111
                                             714/752
(Continued)

FOREIGN PATENT DOCUMENTS

EP          1 524 771 A1    4/2005

OTHER PUBLICATIONS

French Preliminary Search Report dated Oct. 9, 2015 in French Application 15 51116, filed Feb. 11, 2015 (with English Translation of Categories of Cited Documents).

(Continued)

*Primary Examiner* — Thien Nguyen
(74) *Attorney, Agent, or Firm* — Oblon, McClelland, Maier & Neustadt, L.L.P.

(57) ABSTRACT

A message-passing iterative decoding method of an associated LFSR sequence (or M-sequence) as a simplex code, to a parity matrix H. The method includes determining a set of parity polynomials with a low weight obtained by combining the parity equations of the matrix H. For each combination of K such polynomials of this set, an extended parity matrix $H_{ext}$ is built by concatenating elementary parity matrices associated with the parity polynomials of said combination. The combination of parity polynomials leading to a bipartite graph not having cycles with a length 4 and having a minimum number of cycles with lengths 6 and 8 is selected. Then, the LFSR sequence is decoded using the bipartite graph corresponding to the selected combination. This decoding method enables the false-alarm rate to be substantially reduced.

8 Claims, 3 Drawing Sheets

(51) Int. Cl.
    *H03M 13/33* (2006.01)
    *H04B 1/7183* (2011.01)
(52) U.S. Cl.
    CPC ....... *H03M 13/611* (2013.01); *H03M 13/616* (2013.01); *H04B 1/7183* (2013.01)

(56) References Cited

U.S. PATENT DOCUMENTS

| | | | | |
|---|---|---|---|---|
| 8,381,065 | B2* | 2/2013 | Djordjevic | H03M 13/033 375/262 |
| 2002/0116677 | A1 | 8/2002 | Morelos-Zaragoza | |
| 2008/0270872 | A1* | 10/2008 | Shin | H03M 13/1151 714/781 |
| 2009/0217126 | A1* | 8/2009 | Raina | H03M 13/1191 714/752 |
| 2013/0086456 | A1* | 4/2013 | Yedidia | H03M 13/036 714/781 |

OTHER PUBLICATIONS

Fabio Principe et al. "Rapid Acquisition of Gold Codes and Related Sequences Using Iterative Message Passing on Redundant Graphical Models", Proc. MILCOM 2006, Oct. 1, 2006, 7 pages.

Mathieu Des Noes et al. "Improving the Decoding of M-Sequences by Exploiting Their Decimation Property", Proc. 21$^{st}$ European Signal Processing Conference (EUSIPCO 2013), Sep. 9, 2013, 5 pages.

Mathieu Des Noes et al. "Blind Identification of the Uplink Scrambling Code Index of a WCDMA Transmission and Application to Femtocell Networks", Proc. 2013 IEEE International Conference on Communications (ICC), Jun. 9, 2013, 6 pages.

Thorsten Hehn et al. "Multiple-Bases Belief-Propagation Decoding of High-Density Cyclic Codes", IEEE Transactions on Communications, vol. 58, No. 1, Jan. 1, 2010, 8 pages.

Thomas R. Halford et al. "Random Redundant Iterative Soft-in Soft-out Decoding", IEEE Transactions on Communications, vol. 56, No. 4, Apr. 1, 2008, 5 pages.

On Wa Yeung et al. "An Iterative Algorithm and Low Complexity Hardware Architecture for Fast Acquisition of Long PN Codes in UWB Systems", Journal of VLSI Signal Processing Systems for Signal, Image and Video Technology, vol. 43.1, 2006, 11 pages.

Frank R. Kschischang et al. "Factor Graphs and the Sum-Product Algorithm", IEEE Transactions on Information Theory, vol. 47, No. 2, Feb. 2001, 22 pages.

Niclas Wiberg "Codes and Decoding on General Graphs", Linkoping Studies in Science and Technology Dissertation No. 440, 1996, 103 pages.

W. T. Penzhorn et al. "Computation of Low-Weight Parity Checks for Correlation Attacks on Stream Ciphers", Cryptography and Coding, 1995, 10 pages.

Philippe Chose et al. "Fast Correlation Attacks: An Algorithmic Point of View", Advances in Cryptology—EUROCRYPT 2002, 2002, 14 pages.

Thomas R. Halford et al. "An Algorithm for Counting Short Cycles in Bipartite Graphs", IEEE Transactions on Information theory, vol. 52, No. 1, Jan. 2006, 6 pages.

* cited by examiner

ITERATIVE DECODING METHOD OF LFSR SEQUENCES WITH A LOW FALSE-ALARM PROBABILITY

TECHNICAL FIELD

The present invention generally relates to the field of message-passing iterative decoding, and more particularly that of sequences with a maximum length.

STATE OF PRIOR ART

Maximum length sequences, also called M-sequences, are binary sequences having very good correlation properties. For this reason, they are widely used in synchronizing receivers of wireless telecommunication systems or positioning systems.

A conventional method for synchronizing a receiver by means of an M-sequence consists in making a correlation of the received signal with a replica of the M-sequence. If a correlation peak is observed and if its amplitude is higher than a predetermined threshold level, the receiver is synchronized on the peak in question.

It is reminded that an M-sequence is obtained from a primitive generator polynomial. If this polynomial is of degree r, the period of the sequence is maximal, that is of the length $2^r-1$. In practice, an M-sequence can be generated from a feedback shift register, also called LFSR (Linear Feedback Shift Register), the register samples corresponding to the coefficients of the generator polynomial.

FIG. 1 represents an exemplary M-sequence generator using an LFSR register, according to a so-called Fibonacci structure.

The (primitive) generator polynomial used for generating the M-sequence is here:

$$g(x) = \sum_{k=0}^{r} g_k x^k \quad (1)$$

The generator is initialized by a word of r bits which is stored in the shift register. The code thus generated, called a simplex code, is a cyclic code [N,r] where $N=2^r-1$ is the size of the code word and r the number of information bits.

The check polynomial, also called a parity polynomial, associated with the generator polynomial $g(x)$ is $h(x)=(x^N-1)/g(x)$. It can be shown that for the simplex code $h(x)=x^r g(x^{-1})$ and that the parity matrix associated with this code is the matrix H with the size $(N-r) \times N$ given by:

$$H = \begin{bmatrix} g_r & \cdots & g_0 & 0 & \cdots & \cdots & 0 \\ 0 & g_r & \cdots & g_0 & 0 & \cdots & 0 \\ \vdots & \ddots & \ddots & \ddots & \ddots & \ddots & \vdots \\ 0 & \cdots & 0 & g_r & \cdots & g_0 & 0 \\ 0 & \cdots & \cdots & 0 & g_r & \cdots & g_0 \end{bmatrix} \quad (2)$$

An alternative decoding method consists in considering the elements of the M-sequence as variable nodes, and the parity equations they should meet as constraint nodes. It is then possible to make a message-passing iterative decoding in a bipartite graph formed by the variable nodes and the constraint nodes, the edges between the variable nodes and the constraint nodes being given by the elements of the parity matrix. An example of message-passing M-sequence iterative decoding will be found in the paper of O. W. Yeung et al. entitled "An iterative algorithm and low complexity hardware architecture for fast acquisition of long PN codes in UWB systems" published in the Journal of VLSI Signal Processing 43, pp. 25-42, 2006.

In practice, a message-passing M-sequence iterative decoding slowly converges if a bipartite graph based on the parity matrix given by the expression (2) is used. To overcome this difficulty, it has been suggested in the abovementioned paper to combine a plurality of elementary sub-graphs, each elementary sub-graph corresponding to a set of new parity equations. More precisely, the variable nodes remain identical and redundant constraint nodes are introduced. Indeed, the sum of a plurality of parity equations (for example those corresponding to the rows of the matrix H) is still a parity equation.

This consequently results in a graph consisting of several bipartite elementary sub-graphs, these different elementary sub-graphs sharing the set of variable nodes and each elementary sub-graph comprising its specific constraint nodes. In other words, this amounts to using an extending parity matrix, $H_{ext}$ obtained by concatenating K elementary parity matrices:

$$H_{ext} = \begin{bmatrix} H_0 \\ H_1 \\ \vdots \\ H_{K-1} \end{bmatrix} \quad (3)$$

The elementary parity matrices $H_a$ being circulant Toeplitz matrices, with a size $(N-r_a) \times N$ defined by:

$$H_a = \begin{bmatrix} c_{a,0} & \cdots & \cdots & c_{a,r_a} & 0 & \cdots & \cdots & 0 \\ 0 & c_{a,0} & \cdots & \cdots & c_{a,r_a} & 0 & \cdots & 0 \\ \vdots & \ddots & \ddots & \ddots & \ddots & \ddots & \ddots & \vdots \\ \ddots & \ddots & \ddots & \ddots & \ddots & \ddots & \ddots & 0 \\ 0 & \cdots & \cdots & 0 & c_{a,0} & \cdots & \cdots & c_{a,r_a} \\ c_{a,r_a} & \cdots & \cdots & \cdots & 0 & c_{a,0} & \cdots & a_{a,r_a-1} \\ \vdots & \ddots & \cdots & \cdots & 0 & \ddots & \ddots & \vdots \\ c_{a,1} & \cdots & c_{a,r_a} & 0 & \cdots & \cdots & 0 & c_{a,0} \end{bmatrix} \quad (4)$$

Each elementary matrix $H_a$ represents the convolution of the sequence of received samples with a parity polynomial $h_a(x)=1+x^{t_a}+\ldots+x^{r_a}$ with a degree $r_a$ and each row of this matrix corresponds to a parity equation based on this polynomial.

The synchronization of the receiver consists in determining whether a series of M received samples $y=(y_0 \ldots y_{M-1})$, corresponds to a portion of LFSR sequence, in other words to determine whether this series of samples can be decoded by the message-passing decoder. If so, the receiver can deduce therefrom the beginning of the sequence (the initial word in the LFSR register) and the place where the series of samples is in the sequence.

The receiver has consequently to choose between two hypotheses:

$$A_0: y_k = w_k \quad (5\text{-}1)$$

$$A_1: y_k = s_k + w_k \quad (5\text{-}2)$$

where $s_k$ are the elements of the LFSR sequence and $w_k$ are noise samples.

If the receiver determines that it has detected an LFSR sequence (hypothesis $A_1$) whereas the received samples are actually noise (hypothesis $A_0$ valid), there is a false-alarm situation.

It is assumed here, for the sake of simplification, that the receiver observes a series of M=N consecutive samples, in other words a number of samples corresponding to the length of an LFSR sequence.

To choose between the hypotheses $A_0$ and $A_1$, the decoder makes a message-passing iterative decoding of the series of samples, the variable nodes being initialized by means of these samples.

The message-passing decoding can be made in a known manner per se by means of a Sum-product-type algorithm such as described in the paper of Kschichang et al. entitled "Factor graph and the sum-product algorithm" published in IEEE Trans. on Information Theory, vol. 47, no. 2, February 2001, or even a Min-Sum-type algorithm as described in the thesis of N. Wiberg entitled "Codes and decoding on general graphs", University of Linköping, Sweden, 1996.

The receiver determines that the hypothesis $A_1$ is met if:

$$H_{ext}y^T = 0 \quad (6)$$

where $H_{ext}$ is defined by the expressions (3) and (4). In other words, the receiver checks that all the parity equations are met.

It could have been noticed that the choice of the polynomials $h_a(x)$ could strongly influence the false-alarm probability ($P_{FA}$) of the receiver.

FIG. 2 for example shows the false-alarm probability for a receiver decoding an LFSR sequence generated from a generator polynomial the coefficients of which are defined in octal numeration by the word 2415.

For the decoding, an extended parity matrix, $H_{ext}$, constituted by concatenating K=5 elementary parity matrices $H_a$, each matrix $H_a$ corresponding to a polynomial $h_a(x)$ with the weight 3 has been chosen. It is reminded that the weight of a polynomial is the number of its non-zero monomials.

The figure shows the false-alarm probability ($P_{FA}$) as a function of the signal-to-noise ratio (SNR), in reception, for different combinations of K=5 matrices $H_a$. The different combinations, and thus the different matrices $H_{ext}$ are designated by a,b,c,d,e.

It is observed that the false-alarm rate varies by three orders of magnitude depending on the combination of polynomials selected.

The purpose of the present invention is to provide an LFSR sequence (or M-sequence) decoding method having a very low false-alarm rate ($P_{FA}$) without detriment to the convergence speed.

DISCLOSURE OF THE INVENTION

The present invention is defined by a message-passing iterative decoding method of an LFSR sequence with a length N generated by means of a generator polynomial, said LFSR sequence being associated, as a simplex code, with a parity matrix, H, said decoding method comprising the following steps of:

(a) determining a set of parity polynomials, with a weight equal to 3 and a constant equal to 1, corresponding to a combination of parity equations of the matrix H;

(b) generating an extended parity matrix $H_{ext}$ by concatenating a predetermined number K or elementary parity matrices, respectively associated with K parity polynomials selected from said set;

(c) checking that the Tanner graph associated with the matrix $H_{ext}$ does not include a cycle with a length 4 and, in the absence of such a cycle, (d) calculating the number of cycles with a length 6 within the Tanner graph and, in the case where this number is equal to NK storing in a table the combination of parity polynomials selected in step (b);

steps (b), (c), (d) being repeated for all the combinations of K parity polynomials of said set; and (e) calculating for each combination of parity polynomials stored in said table, the number of cycles with the length 8 in the Tanner graph associated with the matrix $H_{ext}$;

(f) selecting a combination of K parity polynomials corresponding to the lowest number of cycles with a length 8 calculated in step (e) to carry out a message-passing iterative decoding of said sequence in the Tanner graph associated with the matrix $H_{ext}$ generated from the combination thus selected.

The checking in step (c) advantageously consists in determining whether one of the following conditions $r_b - i_b = i_a$, $r_b - i_b = r_a$, $r_b - i_b = r_a - i_a$; $r_a - i_a = i_b$ is met for at least any one couple of parity polynomials $g_a(x) = -1 + x^{i_a} + x^{r_a}$ and $g_b(x) = 1 + x^{r_b} + x^{r_b}$, from the K parity polynomials selected in step (b), the absence of a cycle with a length 4 in the Tanner graph being set if none of the previous conditions is met.

The number of cycles with the length 6 in the Tanner graph associated with the matrix $H_{ext}$ can be obtained from $$N_6 = \frac{1}{6}(tr(A^3) - 3KN((K^2 + 3K + 1) - 9(K+1) + 2))$$

where $A = H_{ext}H_{ext}^T$ and tr(.) is the trace function.

The calculation of the number of cycles with the length 8 in the Tanner graph associated with the matrix $H_{ext}$ comprises calculating $tr(A^4) - 4(3K+1)tr(A^3)$ where $A = H_{ext}H_{ext}^T$, and tr(.) is the trace function.

The trace $tr(A^3)$ can be obtained by $$tr(A^3) = \sum_{i=0}^{K-1} \sum_{j=0}^{K-1} \sum_{k=0}^{K-1} T_{ijk}$$

where $$T_{ijk} = \sum_{\alpha \in \Omega_{ji}} \sum_{\beta \in \Omega_{kj}} A_{k,i}(0, \gamma) A_{k,j}(0, \beta) A_{j,i}(0, \alpha), A_{i,j}(\mu, \nu)$$

being the element of the row $\mu$ and the column v of the matrix $A_{i,j} = H_i H_j^T$, where $H_i$ and $H_j$ are elementary parity matrices associated with two parity polynomials from the K parity polynomials selected in step (b), $\alpha = \varphi(s-1)$; $\beta = \varphi(h-1)$; $\gamma = \varphi(s-h)$ where:

$$\varphi(u) = \begin{cases} u \text{ if } 0 \leq u \leq N-1 \\ N+u \text{ if } -N < u < 0 \end{cases}$$

and where $\Omega_{ji}$, $\Omega_{kj}$ are the sets of non-zero elements of the first row of the matrix $A_{i,j}$ and the first row of the matrix $A_{j,k}$ respectively.

The trace $tr(A^4)$ is obtained by calculating $$tr(A^3) = \sum_{i=0}^{K-1}\sum_{j=0}^{K-1}\sum_{k=0}^{K-1}\sum_{l=0}^{K-1} T_{ijkl}$$

where:

$$T_{ijkl} = \sum_{\alpha \in \Omega_{ji}} \sum_{\beta \in \Omega_{kj}} \sum_{\gamma \in \Omega_{lk}} A_{l,i}(0, (\alpha+\beta+\gamma \bmod N)) A_{k,j}(0, \beta) A_{j,i}(0, \alpha) A_{l,k}(0, \gamma)$$

$A_{i,j}(\mu,v)$ being the element at the row $\mu$ and the column $v$ of the matrix $A_{i,j}=H_i H_j^T$, where $H_i$ and $H_j$ are the elementary parity matrices associated with two parity polynomials from the K parity polynomials selected in step (b), $\alpha=\varphi(s-l)$; $\beta=\varphi(h-1)$; $\gamma=\varphi(s-h)$ where:

$$\varphi(u) = \begin{cases} u & \text{if } 0 \leq u \leq N-1 \\ N+u & \text{if } -N < u < 0 \end{cases}$$

and where $\Omega_{ji}$, $\Omega_{kj}$, $\Omega_{lk}$ are the sets of non-zero elements of the first respective rows of the matrices $A_{i,j}$, $A_{j,k}$, $A_{k,l}$.

The iterative decoding advantageously uses a Min-Sum-type algorithm on the Tanner graph associated with the matrix $H_{ext}$ generated from the combination selected in step (e).

Alternatively, the iterative decoding uses a Sum-Product-type algorithm on the Tanner graph associated with the matrix $H_{ext}$ generated from the combination selected in step (e).

In any case, a criterion of convergence can be applied to the values of the variable nodes of the Tanner graph after a predetermined number of iterations and if this criterion is not met, it is concluded that there is an absence of the LFSR sequence.

BRIEF DESCRIPTION OF THE DRAWINGS

Further characteristics and advantages of the invention will appear upon reading preferential embodiments in reference to the appended figures in which.

DETAILED DISCLOSURE OF PARTICULAR EMBODIMENTS

Figure 1:
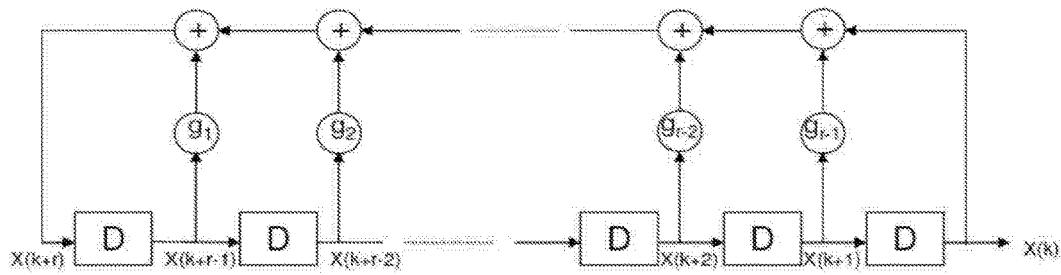
FIG. 1 represents an M-sequence generator according to a Fibonacci representation.
Figure 2:
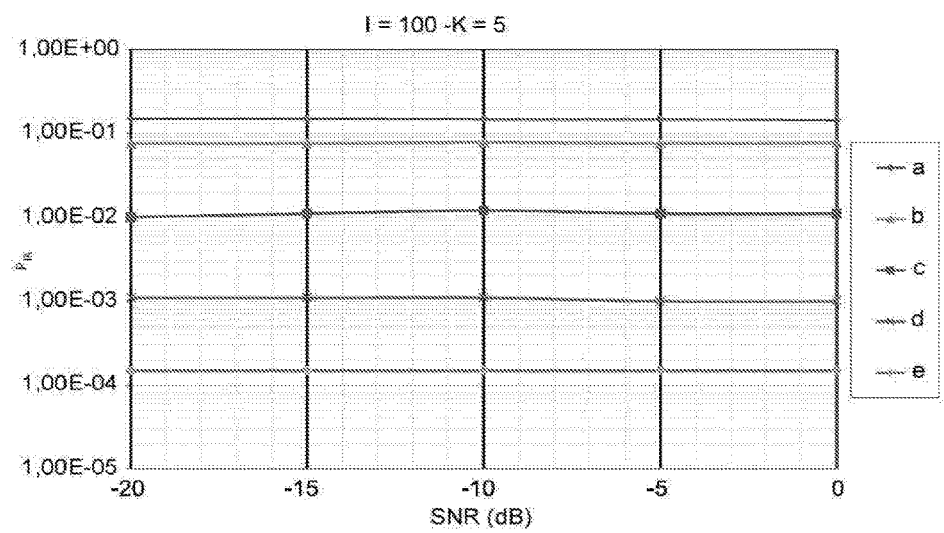
FIG. 2 represents the false-alarm rate of a receiver, for a given LFSR sequence and different parity matrices.

Hereinafter, a receiver that has to be synchronized using an LFSR sequence and more precisely a decoder that has to decide between a presence hypothesis ($A_1$) and an absence hypothesis ($A_0$) of such a sequence will be considered, as described in the introductory part.

The decoder resorts to a message-passing decoding method in a bipartite graph. The bipartite graph consists of a plurality of variable nodes representing the elements of the sequence and a plurality of constraint nodes representing the parity equations to be checked by the elements of the sequence. The graph consists of a plurality K of elementary sub-graphs, said elementary sub-graphs sharing the variable nodes, each elementary sub-graph comprising its own constraint nodes. The edges of each elementary sub-graph are given by the rows of an elementary parity matrix, $H_a$ obtained by combining rows of the parity matrix H, each elementary parity matrix corresponding to a parity polynomial (or check polynomial) $h_a(x)$.

The extended parity matrix $H_{ext}$ associated with the graph is then the concatenation of the elementary parity matrices $H_a$. The message-passing iterative decoding is made using a Sum-product or Min-sum-type algorithm as set out above.

Given that the combination of two rows of the parity matrix H provides again a parity equation, there is, for a given integer K, a great number of possible combinations of parity polynomials. For a given generator polynomial $g(x)$ (and thus a given parity matrix H), the possible combinations of parity polynomials can be obtained, in a known manner per se, according to the method described in the papers by W. T. Penzhorn et al. entitled "Computation of low-weight parity checks for correlation attacks on stream ciphers", Cryptography and Coding, Springer, 1995 and by P. Chose et al. entitled "Fast correlation attacks: an algorithmic point of view", Advances in Cryptology, Eurocrypt 2002, Springer 2002, incorporated herein in reference.

The idea underlining the invention is to resort only to parity polynomials $h_a(x)$ with a weight t=3 and a constant equal to 1, then to make among them a selection to remove the cycles with a length 4 and finally to choose from the remaining ones those which enable the number of cycles with lengths 6 and 8 to be minimized in the bipartite graph (or Tanner graph).

It was in particular possible to show by simulation, in opposition to a commonly accepted idea, that the reduction in the number of cycles with a length 6 in the Tanner graph did not enable the erroneous decoding probability to be reduced but substantially reduced the false-alarm rate. In addition, it could be shown that the reduction in the number of cycles with a length 8 further reduced the false-alarm rate.

The cycles of a bipartite graph are necessarily of an even length (the number of ridges of a cycle is necessarily even). The shorter cycles in such a graph are thus cycles with lengths 4, 6, 8.

A cycle with a length 4 is reflected in the Tanner graph by two variable nodes both connected to two same constraint nodes (butterfly-shaped circuit between two variable nodes and two constraint nodes) and in the extended parity matrix $H_{ext}$ by elements equal to 1 at the vertices of a rectangle.

The polynomials with a weight 3, respectively associated with the matrices $H_a$ and $H_b$, are noted $g_a(x)=1+x^{i_a}+x^{r_a}$ and $g_b(x)=1+x^{i_b}+x^{r_b}$ where $r_a$ and $r_b$ are the degrees of the polynomials $g_a(x)$ and $g_b(x)$.

If it is assumed that $r_a \geq r_b$, it can be seen that because of the Toeplitz structure of the matrices $H_a$ and $H_b$, a cycle with a length 4 in the bipartite graph (associated with the extended parity matrix $H_{ext}$) can only exist if and only if one of the following conditions is met:

$$r_b - i_b = i_a \tag{7-1}$$

$$r_b - i_b = r_a \tag{7-2}$$

$$r_b - i_b = r_a - i_a \tag{7-3}$$

$$r_a - i_a = i_b \tag{7-4}$$

In other words, to exclude the cycles with a length 4, it is sufficient to choose a combination of generator polynomials such that, for any two polynomials $g_a(x)$, $g_b(x)$ belonging to this combination, none of the conditions (7-1) to (7-4) is met.

The number of cycles with a length 6 in the Tanner graph can be obtained by using the general method described in the paper of T. R. Halford et al. entitled "An algorithm for counting short cycles in bipartite graphs", published in IEEE Trans. on Information Theory, vol. 52, no. 1, January 2006, pp. 287-292.

More precisely, the following operators are defined:

$$Y = X - \lambda = [y(i,j)] \text{ where } y(i,j) = x(i,j) - \lambda \quad (8\text{-}1)$$

$$U = \max(X, 0) = [u(i,j)] \text{ where } u(i,j) = \max(0, x(i,j)) \quad (8\text{-}2)$$

$$V = X \cdot Y = [v(i,j)] \text{ where } v(i,j) = x(i,j) y(i,j) \quad (8\text{-}3)$$

$$Z(X) = X - X \cdot I \quad (8\text{-}4)$$

It is thus understood that the operator · represents the Hadamard multiplication and the operator $Z(.)$ cancels the diagonal of the matrix to which it is applied.

The following matrices are further defined:

$$A = H_{ext} H_{ext}^T \quad (9\text{-}1)$$

$$B = H_{ext}^T H_{ext} \quad (9\text{-}2)$$

$$\tilde{A} = A \cdot I \quad (9\text{-}3)$$

$$\tilde{B} = B \cdot I \quad (9\text{-}4)$$

$$\tilde{A}_m = \max(\tilde{A} - 1, 0) \quad (9\text{-}5)$$

$$\tilde{B}_m = \max(\tilde{B} - 1, 0) \quad (9\text{-}6)$$

It can be shown that the number of cycles with a length 6 is equal to:

$$N_6 = \frac{1}{6} tr(L) \quad (10\text{-}1)$$

with $$L = Z(A)A^2 - A\tilde{B}_m BE^T - Z(A\tilde{A}_m)A - EZ(B\tilde{B}_m)E^T + \tilde{A}_m E \tilde{B}_m E^T \quad (10\text{-}2)$$

The matrices A and B depend on the extended parity matrix $H_{ext}$ and consequently on the selected combination of parity polynomials. It is reminded that the extended parity matrix is formed by concatenating K elementary parity matrices $H_{ext} = [H_{a(1)}^T H_{a(2)}^T \ldots H_{a(K)}^T]^T$ where $g_{a(k)}(x) = 1 + x^{i_{a(k)}} + x^{r_{a(k)}}$ is the parity polynomial associated with the parity matrix $H_{a(k)}$, the combination of parity polynomials being formed by the polynomials $g_{a(k)}(x)$, $k=1, \ldots, K$.

Because the elementary parity matrices $H_{a(k)}$ are circulant, it can be shown that the expression (10-2) can be simplified as:

$$N_6 = \frac{1}{6}(tr(A^3) - 3KN((K^2 + 3K + 1) - 9(K + 1) + 2)) \quad (11)$$

In other words, given that K and N are constants, minimizing the number of cycles with a length 6 in the Tanner graph amounts to minimizing the trace of the matrix $A^3$.

On the other hand, it is possible to determine the minimal number of cycles with a length 6. Indeed, it can be shown that 3 cycles with a length 6 pass through each variable node.

Figure 3:
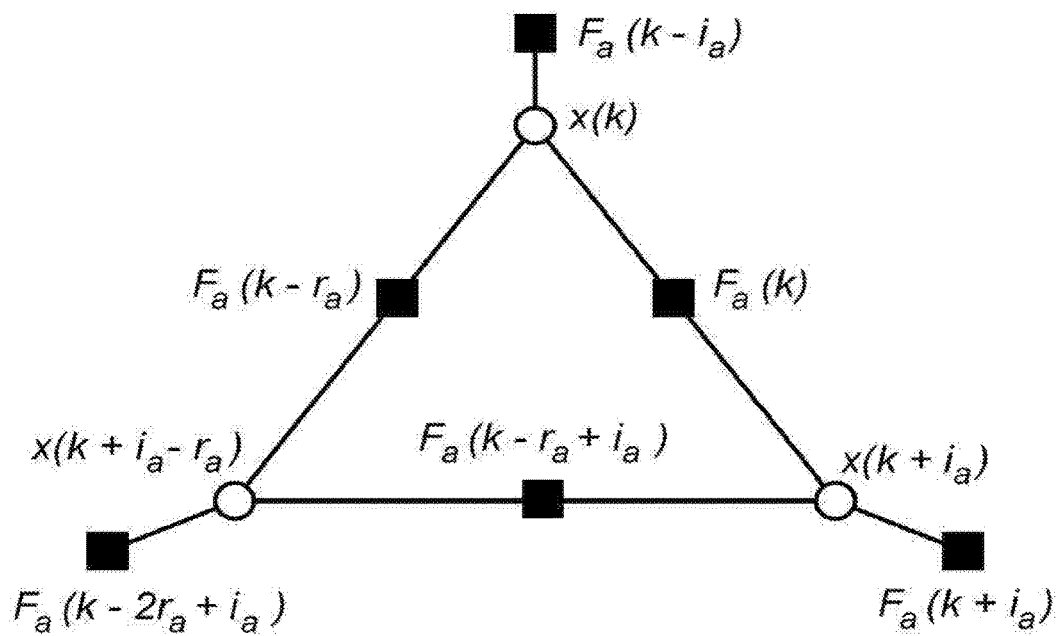
FIG. 3 represents a cycle with a length 6 in the bipartite graph used by the decoder.

FIG. 3 shows a cycle with a length 6 passing through the variable nodes $z(k)$, $z(k+i_a)$, $z(k+i_a-r_a)$ and the constraint nodes $F_a(k)$, $F_a(k-r_a)$, $F_a(k-r_a+i_a)$ (each representing a parity equation of the matrix $H_a$). The 2 other cycles are deduced from the one represented by replacing k by $k-i_a$ and $k-r_a-i_a$. Given that each cycle involves 3 variable nodes, the minimum number of cycles with a length 6 is:

$$N_6^{min} = NK \quad (12)$$

In the same way as previously, the number of cycles with a length 8 in the Tanner graph can be calculated for each extended parity matrix $H_{ext} = [H_{a(1)}^T H_{a(2)}^T \ldots H_{a(K)}^T]^T$, corresponding to a given combination of the parity polynomials $g_{a(k)}(x)$, $k=1, \ldots, K$:

$$N_8 = \frac{1}{8}(tr(A^4) - 4(3K+1)tr(A^3) + Q(N, K)) \quad (13)$$

where $Q(N,K)$ is a value which only depends on the constants K,N. Thereby, it is understood that minimizing the number of cycles with a length 8 amounts to minimizing $tr(A^4) - 4(3K+1)tr(A^3)$ on the set of possible combinations $g_{a(k)}(x)$, $k=1, \ldots, K$.

Figure 4:
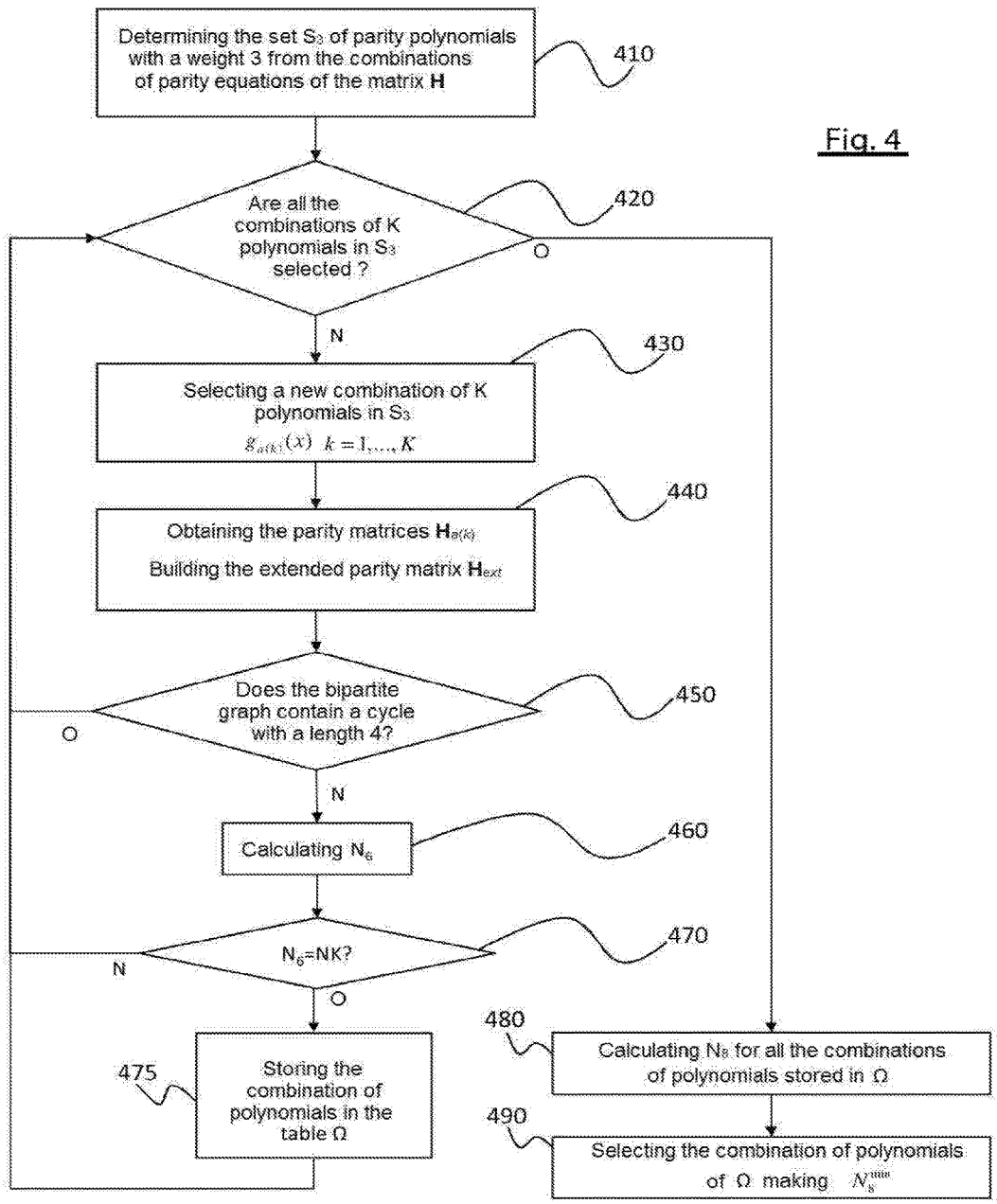
FIG. 4 schematically represents a flowchart of the decoding method according to one embodiment of the invention.

FIG. 4 represents a flowchart of the decoding method according to one embodiment of the invention.

It is assumed that the receiver knows the generator polynomial of the M-sequence or, equivalently, the parity matrix H of this sequence (parity matrix of a simplex code).

The length N of the sequence is supposed to be known and a number K of parity polynomials, or equivalently, of elementary parity matrices $H_a$ is set.

It will be supposed hereinafter, to simplify the presentation, that the receiver processes N successive samples. The decoding method however is also applicable to the case where the receiver only receives M<N samples.

In step 410, the set $S_3$ of parity polynomials with a weight 3 and a constant equal to 1, which are obtained by combining the parity equations of the matrix H is determined.

Given that the simplex code $[2^r-1, r]$ is the dual of the Hamming code $[2^r-1, 2^r-r-1]$, the number $A_3$ of parity equations (or polynomials) with a weight 3 and a constant equal to 1 is equal to the number of words of the Hamming code with the weight 3 and a constant equal to 1, that is:

$$A_3 = 2^{r-1} - 1 \quad (14)$$

In step 420, it is checked whether all the combinations of the K parity polynomials from the set $S_3$ have already being selected. If so, step 480 is proceeded.

If all the combinations of K parity polynomials from the set $S_3$ have not been selected, a new combination of K polynomials is selected in step 430, $g_{a(k)}(x)$, $k=1, \ldots, K$.

In step 440, the corresponding parity matrices $H_{a(k)}$, $k=1, \ldots, K$ are deduced from the K parity polynomials thus selected. The elements of these matrices are given by the expression (4). Then, the extended parity matrix $H_{ext} = [H_{a(1)}^T H_{a(2)}^T \ldots H_{a(K)}^T]^T$ is formed.

In step 450, it is checked that the bipartite graph corresponding to the extended parity matrix $H_{ext}$ does not include a cycle with a length 4. For this, it is determined whether any couple of polynomials from the K selected parity polynomials meets one of the conditions (7-1)-(7-4). If so, the method goes back to step 420. Otherwise, step 460 is proceeded.

It will be noted that steps 440 and 450 can be inverted.

In step 460, the number, $N_6$, of cycles with a length 6 is calculated in the bipartite graph corresponding to the extended parity matrix $H_{ext}$. This calculation can be made from the expression (11).

In step 470, it is checked whether $N_6$=NK. If not, the method directly go back to step 420. On the other hand, if so, the bipartite graph contains a minimal number of cycles with a length 6 and the combination of the polynomials $g_{a(k)}(x)$, k=1, ..., K is stored in a table $\Omega$ in 475, and then the method goes back to step 420 to select a new combination of polynomials of $S_3$ (if they have not all been already selected).

In step 480, for each combination of polynomials stored in the table $\Omega$, the number $N_8$ of cycles with a length 8 is calculated in the bipartite graph corresponding to the extended parity matrix $H_{ext}$. To that end, it will be sufficient to calculate the part of $N_8$ which depends on the choice of the combination, in other words $tr(A^4)-4(3K+1)tr(A^3)$.

In 490, the combination C of parity polynomials $g_{a(k)}(x)$, k=1, ..., K which minimizes $N_8$ is retained, in other words the combination:

$$C = \arg\min_{\{g_{a(k)}(x), k=1,\ldots,L\} \in \Omega} (N_8) \quad (15)$$

The combination C of polynomials thus retained and the bipartite graph associated with the corresponding matrix $H_{ext}$ are then used to decode the sequence of the received samples.

If, after a predetermined number of iterations, a convergence criterion is not fulfilled, the receiver concludes for the hypothesis $A_0$, otherwise, it concludes for the hypothesis $A_1$. The convergence criterion can be for example a mean of the absolute values of the variable nodes, expressed as Log Likelihood Ratios (LLR). In the latter case, the mean of the absolute values can be compared with a threshold to decide for the hypothesis $A_0$ or $A_1$.

The calculation of the numbers of cycles $N_6$ and $N_8$ can however be complex because of the terms $tr(A^3)$ and $tr(A^4)$, since the size of the matrix A can reach 1000×1000.

It is however possible to simplify the calculation of the traces in question by taking advantage of the circulant nature of the elementary parity matrices $H_a$.

More precisely, if $A_{i,j}=H_i H_j^T$ is set, the matrix A can be expressed as:

$$A = \begin{bmatrix} A_{0,0} & A_{0,1} & \cdots & A_{0,N-1} \\ A_{1,0} & A_{1,1} & \cdots & A_{1,N-1} \\ \vdots & \vdots & \ddots & \vdots \\ A_{N-1,0} & A_{N-1,1} & \cdots & A_{N-1,N-1} \end{bmatrix} \quad (16)$$

If $T_{ijk}=tr(A_{i,j}A_{k,j}A_{ik})$ is set, the trace of $A^3$ can be obtained in the following way:

$$tr(A^3) = \sum_{i=0}^{K-1} \sum_{j=0}^{K-1} \sum_{k=0}^{K-1} T_{ijk} \quad (17)$$

with, by assuming i≥j≥k:

$$T_{ijk} = \sum_{s=0}^{N-1} \sum_{h=0}^{N-1} \sum_{l=0}^{N-1} A_{k,i}(0, \varphi(s-l))A_{k,j}(0, \varphi(h-l))A_{j,i}(0, \varphi(s-h)) \quad (18)$$

where:

$$\varphi(u) = \begin{cases} u & \text{if } 0 \le u \le N-1 \\ N+u & \text{if } -N < u < 0 \end{cases} \quad (19)$$

Thereby, it can be shown that:

$$T_{ijk} = \sum_{\alpha \in \Omega_{ji}} \sum_{\beta \in \Omega_{kj}} A_{k,i}(0, \gamma)A_{k,j}(0, \beta)A_{j,i}(0, \alpha) \quad (20)$$

where $\alpha=\varphi(s-l)$; $\beta=\varphi(h-l)$; $\gamma=\varphi(s-h)=(\alpha+\beta) \mod N$ and where $\Omega_{ji}$ is the set of the non-zero elements of the first row of the matrix $A_{ij}$, that is $\Omega_{ji}=\{m|A_{j,i}(0, m)\neq 0\}$. It can be shown that $\Omega_{ji}$ contains 9 indices if i≠j and 7 indices otherwise. The calculation of the trace of $A^3$ in step 460 is thus dramatically simplified.

In a similar way, if $T_{ijkl}=tr(A_{i,j}A_{k,j}A_{i,k}A_{l,k})$ is set, the calculation of the trace of $A^4$ in step 480 can be simplified from:

$$tr(A^4) = \sum_{i=0}^{K-1} \sum_{j=0}^{K-1} \sum_{k=0}^{K-1} \sum_{l=0}^{K-1} T_{ijkl} \quad (21)$$

$$T_{ijkl} = \sum_{\alpha \subset \Omega_{ji}} \sum_{\beta \subset \Omega_{kj}} \sum_{\gamma \subset \Omega_{lk}} A_{l,i}(0, (\alpha+\beta+\gamma \mod N)) \quad (22)$$

$$A_{k,j}(0, \beta)A_{j,i}(0, \alpha)A_{l,k}(0, \gamma)$$

with the same notation conventions as previously.

Hereinafter, it has been supposed that the selection of the parity polynomials, $g_{a(k)}(x)$, k=1, ..., K and the building of the corresponding extended parity matrix $H_{ext}$ was made at the receiver. However, it will be understood that the selection of the parity polynomials and the building of the extended parity matrix can alternatively be made only once, optionally for different generator polynomials (in other words for different possible M-sequences) and the results of this selection/building be stored at the receiver.

The invention claimed is:

1. A message-passing iterative decoding method comprising the following steps of:
   at the receiver, receiving samples of a signal over a wireless telecommunication system and which are to be checked for correspondence to a portion of an LFSR sequence with a length N generated with a generator polynomial, said LFSR sequence being associated, as a simplex code, with a parity matrix, H, and determining whether the samples of the signal correspond to the portion of the LFSR sequence by:
   (a) determining a set of parity polynomials, with a weight equal to 3 and a constant equal to 1, corresponding to a combination of parity equations of the parity matrix H;
   (b) generating an extended parity matrix H, by concatenating a predetermined number K or elementary parity matrices, respectively associated with K parity polynomials selected from said set of parity polynomials;

(c) checking a length of cycles in a Tanner graph generated from the parity matrix H and checking that the Tanner graph associated with the extended parity matrix $H_{ext}$ does not include a cycle with a length 4 and, in an absence of such a cycle, (d) calculating a number of cycles with a length 6 within the Tanner graph and, in when the number of cycles with a length 6 is equal to NK, storing in a table a combination of the K parity polynomials selected in step (b);

steps (b), (c), (d) being repeated for all combinations of the K parity polynomials of said set; and (e) calculating for each combination of the K parity polynomials stored in said table a number of cycles with the length 8 in the Tanner graph associated with the extended parity matrix $H_{ext}$;

(f) selecting a combination of K parity polynomials corresponding to a lowest number of cycles with a length 8 calculated in step (e) to carry out a message-passing iterative decoding of said sequence in the Tanner graph associated with the extended parity matrix $H_{ext}$ generated from the combination of K parity polynomials thus selected, wherein a criterion of convergence to values of nodes of variables of the Tanner graph is applied after a predetermined number of iterations and when the criterion of convergence is not met, it is concluded that there is an absence of the LFSR sequence in the received samples of the signal and the samples of the signal are determined to be only samples of noise, and when the criterion of convergence is met by predetermined number of iterations, the receiver synchronizes the received samples of the signal with the LFSR sequence.

2. The iterative decoding method according to claim 1, wherein checking in step (c) consists in determining whether one of following conditions $r_b - i_b = i_a$, $r_b - i_b = r_a$, $r_b - i_b = r_a - i_a$; $r_a - i_a = i_b$ is met for at least any one couple of parity polynomials $g_a(x) = 1 + x^{i_a} + x^{r_a}$ and $g_b(x) = 1 + x^{i_b} + x^{r_b}$, from the K parity polynomials selected in step (b), where $r_a$ and $r_b$ are the degrees of the parity polynomials $g_a(x)$ and $g_b(x)$, $i_a$ and $i_b$ are the degrees of the monomials within the parity polynomials $g_a(x)$ and $g_b(x)$, and the absence of a cycle with a length 4 in the Tanner graph being set if none of the previous conditions $r_b - i_b = i_a$, $r_b - i_b = r_a$, $r_b - i_b = r_a - i_a$; $r_a - i_a = i_b$ is met.

3. The iterative decoding method according to claim 1, wherein the number of cycles with a length 6 in the Tanner graph associated with the extended parity matrix $H_{ext}$ is obtained from $$N_6 = \frac{1}{6}(tr(A^3) - 3KN((K^2 + 3K + 1) - 9(K+1) + 2))$$

where $A = H_{ext} H_{ext}^T$ and tr(.) is the trace function.

4. The iterative decoding method according to claim 1, wherein calculating the number of cycles with a length 8 in the Tanner graph associated with the extended parity matrix $H_{ext}$ comprises calculating $tr(A^4) - 4(3K+1)tr(A^3)$ where $A = H_{ext} H_{ext}^T$ and tr(.) is the trace function.

5. The iterative decoding method according to claim 3, wherein a trace $tr(A^3)$ is obtained by calculating $$tr(A^3) = \sum_{i=0}^{K-1} \sum_{j=0}^{K-1} \sum_{k=0}^{K-1} T_{ijk}$$

where:

$$T_{ijk} = \sum_{\alpha \in \Omega_{ji}} \sum_{\beta \in \Omega_{kj}} A_{k,i}(0, \gamma) A_{k,j}(0, \beta) A_{j,i}(0, \alpha)$$

$A_{i,j}(\mu, v)$ being the element at a row $\mu$ and a column v of the matrix $A_{i,j} = H_i H_j^T$, where $H_i$ and $H_j$ are elementary parity matrices associated with two parity polynomials from the K parity polynomials selected in step (b), and where $\Omega_{ji}$, $\Omega_{kj}$ are sets of non-zero elements of a first row of a matrix $A_{i,j}$ and a first row of a matrix $A_{j,k}$, respectively.

6. The iterative decoding method according to claim 4, wherein trace $tr(A^4)$ is obtained by calculating $$tr(A^4) = \sum_{i=0}^{K-1} \sum_{j=0}^{K-1} \sum_{k=0}^{K-1} \sum_{l=0}^{K-1} T_{ijkl}$$

where:

$$T_{ijkl} = \sum_{\alpha \in \Omega_{ji}} \sum_{\beta \in \Omega_{kj}} \sum_{\gamma \in \Omega_{lk}} A_{l,i}(0, (\alpha + \beta + \gamma \bmod N)) A_{k,j}(0, \beta) A_{j,i}(0, \alpha) A_{l,k}(0, \gamma)$$

$A_{j,k}(\mu, v)$ being an element at a row $\mu$ and a column v of a matrix $A_{j,k} = H_i H_j^T$, where $H_i$ and $H_j$ are elementary parity matrices associated with two parity polynomials from the K parity polynomials selected in step (b) and where $\Omega_{ji}$, $\Omega_{kj}$, $\Omega_{lk}$ are sets of non-zero elements of first respective rows of matrices $A_{i,j}$, $A_{j,k}$, $A_{k,l}$.

7. The iterative decoding method according to claim 1, wherein a Min-Sum-type algorithm is used on the Tanner graph associated with the extended parity matrix $H_{ext}$ generated from the combination of K parity polynomials selected in step (f).

8. The iterative decoding method according to claim 1, said method further comprising using a Sum-Product-type algorithm on the Tanner graph associated with the extended parity matrix $H_{ext}$ generated from the combination of K parity polynomials selected in step (f).

* * * * *